(12) United States Patent
McReynolds et al.

(10) Patent No.: US 12,710,450 B2
(45) Date of Patent: Aug. 18, 2026

(54) ABBREVIATED LOOPBACK ATTENUATION

(71) Applicant: FormFactor, Inc., Livermore, CA (US)

(72) Inventors: Ernest Gammon McReynolds, Beaverton, OR (US); Jerry Martyniuk, Portland, OR (US); Tim Lesher, Portland, OR (US); Tomoe Yokoyama, Beaverton, OR (US); David Raschko, Tigard, OR (US); Uyen Nguyen, Milpitas, CA (US); Pratik Bakul Ghate, Beaverton, OR (US)

(73) Assignee: FormFactor, Inc., Livermore, CA (US)

( * ) Notice: Subject to any disclaimer, the term of this patent is extended or adjusted under 35 U.S.C. 154(b) by 188 days.

(21) Appl. No.: 18/205,735

(22) Filed: Jun. 5, 2023

(65) Prior Publication Data

US 2023/0393174 A1 Dec. 7, 2023

Related U.S. Application Data

(60) Provisional application No. 63/348,880, filed on Jun. 3, 2022.

(51) Int. Cl.
*G01R 1/073* (2006.01)
*G01R 31/28* (2006.01)

(52) U.S. Cl.
CPC ..... *G01R 1/07378* (2013.01); *G01R 31/2889* (2013.01)

(58) Field of Classification Search
CPC ........................ G01R 1/07378; G01R 31/2889
See application file for complete search history.

(56) References Cited

U.S. PATENT DOCUMENTS

| | | | | |
|---|---|---|---|---|
| 6,215,320 B1 * | 4/2001 | Parrish | H05K 1/112 | 428/209 |
| 6,218,910 B1 * | 4/2001 | Miller | G01R 1/073 | 333/33 |
| 6,603,323 B1 * | 8/2003 | Miller | G11C 29/56 | 324/754.14 |
| 7,012,442 B2 | 3/2006 | Miller | | |
| 8,232,818 B2 | 7/2012 | Desta | | |
| 2003/0210067 A1 | 11/2003 | Miller | | |
| 2004/0036493 A1 * | 2/2004 | Miller | G01R 31/2889 | 324/754.14 |
| 2005/0001638 A1 * | 1/2005 | Miller | G01R 31/31926 | 324/754.07 |

(Continued)

FOREIGN PATENT DOCUMENTS

| | | |
|---|---|---|
| TW | M473518 U | 1/2014 |
| WO | 2022111804 A1 | 6/2022 |

OTHER PUBLICATIONS

Translation PCT/US23/24424 (Year: 2023).*
Michael Steer, "Fundamentals of Microwave and RF Design (3rd edition)," NC State University, 2019, 28 pages.

*Primary Examiner* — Paresh Patel
(74) *Attorney, Agent, or Firm* — LUMEN PATENT FIRM

(57) ABSTRACT

Improved performance for attenuated testing when probing a device under test with a probe array is provided. By moving the attenuation components from their conventional location on the printed circuit board of the probe head to the space transformer of the probe head, electrical path lengths can be decreased, thereby improving performance. This is particularly helpful in connection with loopback testing.

13 Claims, 5 Drawing Sheets

(56) References Cited

U.S. PATENT DOCUMENTS

2005/0174131 A1* 8/2005 Miller .................. G01R 1/0491 324/754.21
2005/0237073 A1 10/2005 Miller
2006/0170435 A1* 8/2006 Granicher .......... G01R 1/07385 324/754.07
2007/0261009 A1 11/2007 Granicher
2011/0115512 A1 5/2011 Miller
2014/0239994 A1* 8/2014 Alves Moreira ...... G01R 1/067 324/754.03
2015/0048861 A1 2/2015 Kuo
2015/0168531 A1 6/2015 Ku
2015/0377946 A1* 12/2015 Sinsheimer ...... G01R 31/31905 324/762.01
2017/0146632 A1 5/2017 Wadell
2018/0024167 A1* 1/2018 Maggioni .......... G01R 1/07342 324/750.24
2021/0063478 A1* 3/2021 Vettori ................. G01R 1/0735
2023/0393174 A1 12/2023 McReynolds
2024/0410936 A1* 12/2024 McReynolds ...... G01R 31/2889

* cited by examiner

ABBREVIATED LOOPBACK ATTENUATION

CROSS REFERENCE TO RELATED APPLICATIONS

This application claims priority from U.S. Provisional Patent Application 63/348,880 filed Jun. 3, 2022, which is incorporated herein by reference.

FIELD OF THE INVENTION

This invention relates to testing of a device under test using electrical probes.

BACKGROUND

Current state of the art methods of validating RF, digital, and mixed signal devices under test (DUTs) require that high-speed channels be exercised in realistic operational scenarios. To address this, device vendors employ PCB-based attenuator circuits (PCB=printed circuit board), to provide testing solutions that employ long-length loopback structures which are test board mounted. This incurs difficulty in achieving the desired attenuation due to multiple losses through interfaces, connectors, and various transmission lines. Thus, these approaches suffer from numerous performance constraints including increased insertion loss, negative impacts to signal integrity, and unrealistic signal timing conditions relative to real-world operational scenarios. Further downsides of existing approaches include limited attenuator impedances and attenuation levels, making existing approaches suboptimal for current generation high-performance RF device testing.

SUMMARY

In this work, space transformer and MLO-based attenuators (MLO=multi-layer organic substrate) overcome all these issues while simultaneously providing user-tunable impedances and attenuation levels. By varying design parameters, the attenuators can be individually tuned to a user's specific requirements. Placement of the attenuator on the space transformer eliminates path-introduced performance limitations of current state of the art approaches. Moving the attenuators to the space transformer permits accurate achievement of target attenuation values as well as simplifying the test apparatus.

This work provides a methodology for implementation of space transformer and MLO-based attenuators for use in wafer-probe applications. The description below considers one specific implementation of a differential attenuator, although the techniques here can be applied to non-differential attenuators as well with negligible changes.

Typical applications for surface mounted attenuator structures include wafer probe products, pin probes, and MEMs (micro-electrical-mechanical systems) probe types. These structures can also be used with extended membranes, membrane-based daughtercards, and space transformers including MLOs.

Significant advantages are provided. As data rates continue to double every 2-3 years, the loss in the digital communication channels increases as well. To counter this loss, novel approaches to equalization and loss compensation are being included in the silicon of the die. To properly exercise the equalization and loss compensation in the die during wafer test, the probe card loss should match the expected environmental or module loss that the device will be used in. This loss matching can be accomplished using the solution described above. Previously employed techniques using discrete components are too large to fit sufficient quantities on the probe card.

Currently, customers route RX/TX (receive/transmit) loopback from probe or space transformer to the test board. This makes for additional test solution complexity as well as incurring difficulty in realizing the desired values of signal attenuation. Providing a short loopback solution through mounting attenuation close to the device under test both reduces solution complexity as well as makes the realization of target attenuation certain. Additionally, by matching the expected module or system loss to that which a device will operate in enables testing of the loss compensation techniques being employed by the device, which was not previously possible. This allows for full-functional testing of the device under test.

Another significant advantage is the ability to tune the impedance and attenuation level to any desired value. Additionally, this new technique uses less space compared to previous techniques and allows for the circuitry to be employed for differential pairs instead of just single-ended systems.

Significant features of this work include the use of networked SMT (surface mount technology) components that when combined, allow for the miniaturization of attenuation circuits on the probe card, enabling the employment of the attenuation on a space transformer that sits between the wafer contactor and the Printed Circuit Board (PCB) that interfaces with the tester apparatus. In addition to the attenuation being moved from the Printed Circuit Board to the Space Transformer, this approach enables the use of SMT components to tune both the loss profile of the probe card and to match the impedance to any needed value while previous techniques utilized discrete attenuator components that were only capable of matching a single impedance (typically 50 ohm).

Conventional approaches usually employ a signal path out to a connectorized attenuation device. Disadvantages of this conventional method include poor performance due to losses in the signal path and connector and loss of usable space on the tester PCB. SMT attenuator components are available but work for only Single-ended systems and are limited to a single target impedance, typically 50 ohms.

DETAILED DESCRIPTION

Figure 1:
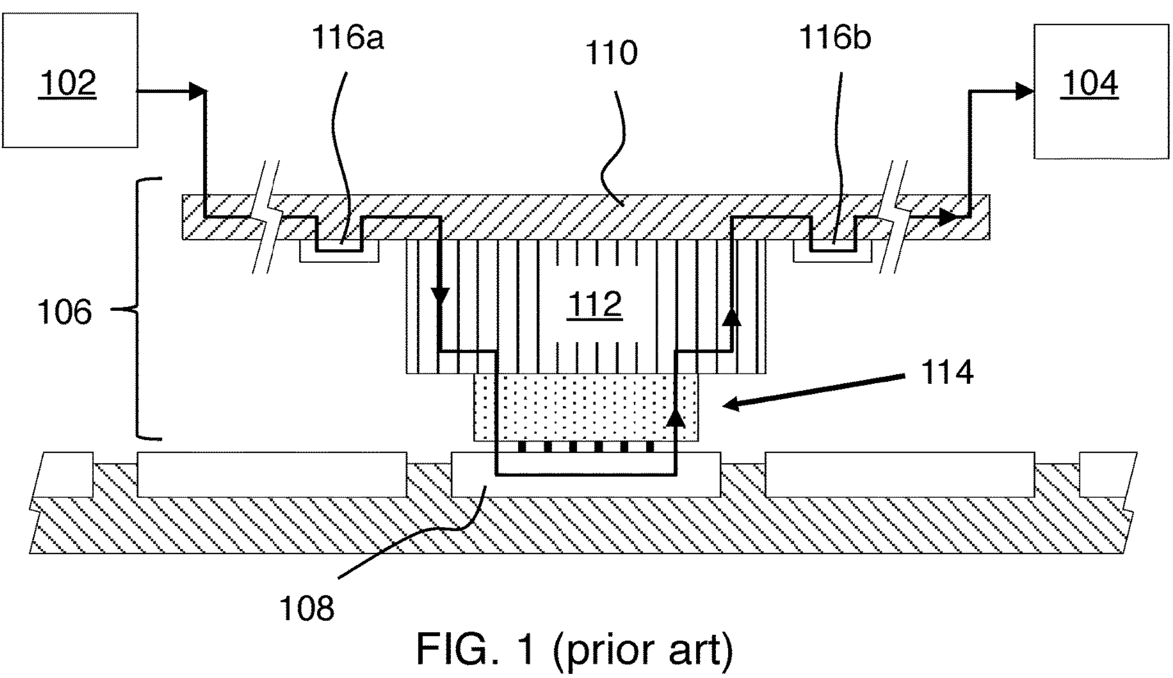
FIG. 1 shows a prior art probe head.

FIG. 1 shows an exemplary prior art probe head configuration. In this example, a probe head 106 is used to test a device under test 108. Probe head 106 includes a printed circuit board or the like 110, a space transformer 112, and a probe array 114. In some testing applications, attenuation is provided for signals sent to and/or received from the device under test. Conventionally such attenuation is provided by components 116*a*, 116*b* disposed on printed circuit board 110. Here component 116*a* provides attenuation for signals from test source 102 to device under test 108. Component 116*b* provides attenuation for signals from device under test 108 to test sink 104. These signal paths are shown on FIG. 1 as black lines with arrows.

Figure 2:
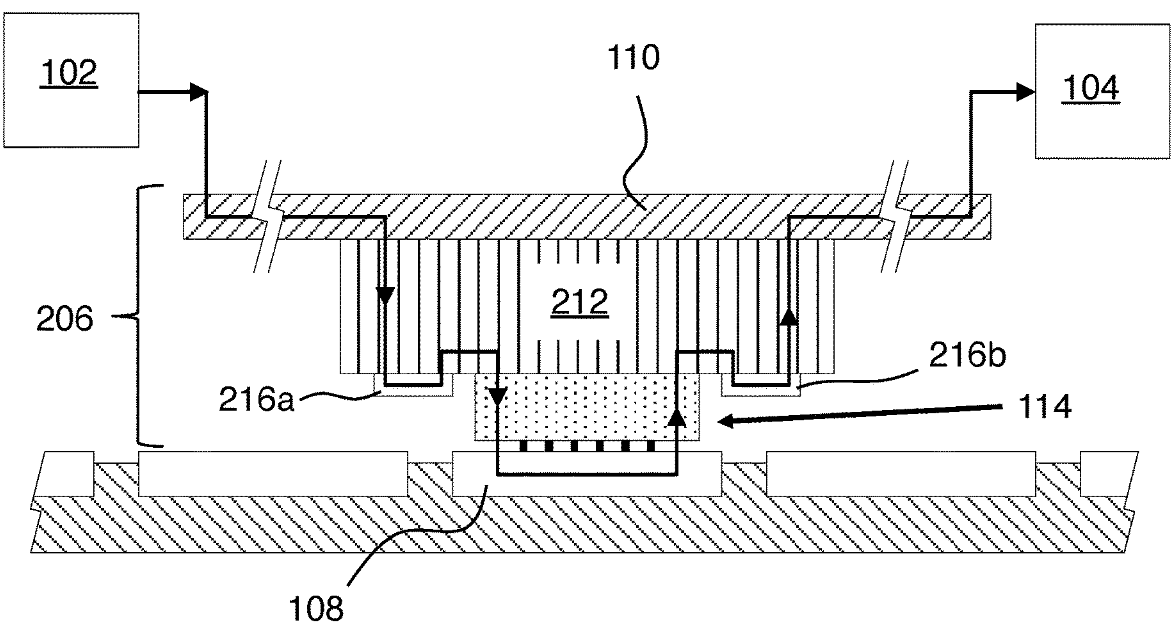
FIG. 2 shows a probe head operating in accordance with an embodiment of the invention.

FIG. 2 shows an exemplary probe head operating according to an embodiment of the invention. In this example, a probe head 206 is used to test a device under test 108. Probe head 206 includes a printed circuit board or the like 110, a space transformer 212, and a probe array 114. Here attenuation is provided by components 216*a* and/or 216*b* disposed on space transformer 212. Component 216*a* provides attenuation for signals from test source 102 to device under test 108. Component 216*b* provides attenuation for signals from device under test 108 to test sink 104. These signal paths are shown on FIG. 2 as black lines with arrows.

Accordingly, an exemplary embodiment of the invention is a method of providing a specified attenuation for probe testing. The method includes: making temporary electrical contact between a probe head and a device under test; and performing electrical testing of the device under test using the probe head, where the probe head includes a space transformer having a first side in electrical contact with test equipment and a second side in direct electrical contact with a probe array. Here direct electrical contact means that the probes directly contact the space transformer, as opposed to making electrical contact with the space transformer via some intervening structure.

In this example, the electrical testing includes at least one test where a first probe of the probe array sends a first signal to the device under test and where a second probe of the probe array receives a second signal from the device under test. The first signal and/or the second signal is attenuated by one or more resistive components disposed on the space transformer.

Here a space transformer is defined to be any structure that provides a 1:1 mapped transformation from one contact grouping to another contact grouping. Typically each contact grouping will be of different size and/or configuration, however it is not required. In common practice contact points on each contact grouping are physically different sizes although this is not a requirement for this technology.

The frequency of the electrical testing can be in a range from 0.1 GHz to 120 GHz. A "device under test" can be a single integrated circuit, or it can be a wafer (or any part of a wafer) including multiple integrated circuits.

The resistive components can include resistors disposed on a membrane substrate that is disposed on the space transformer. Alternatively, the resistive components can include resistors disposed on a multi-level organic substrate that is disposed on the space transformer. The resistive components can include surface mount technology components. Any other approach for providing suitable resistance values on the space transformer can also be employed.

The transmission line impedance of the first and second probes can be 50Ω. Alternatively, the transmission line impedance of the first and second probes can be a specified value other than 50Ω (e.g., 35Ω, 75Ω, 100Ω, etc.).

Figure 3A:
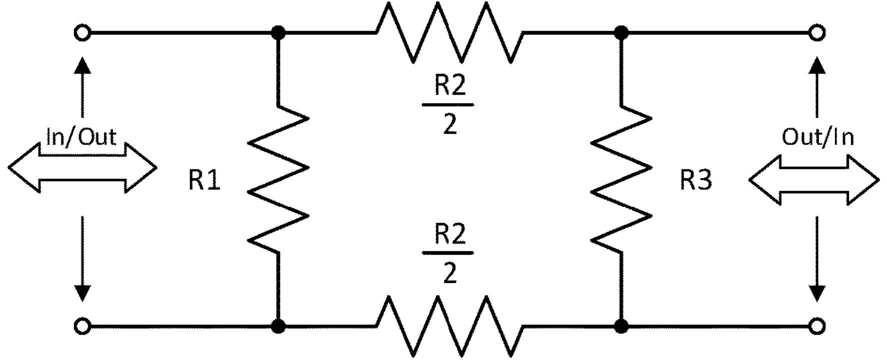
FIG. 3A is an exemplary electrical schematic for an attenuator disposed on a space transformer.
Figure 3B:
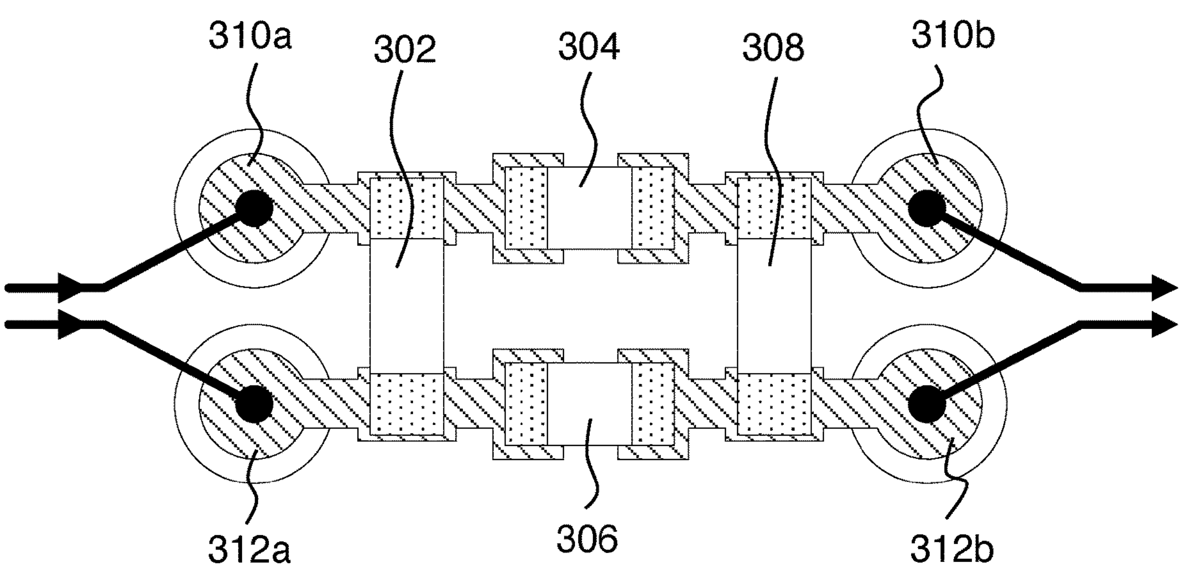
FIGS. 3B-C show exemplary implementations of attenuators on a space transformer.
Figure 3C:
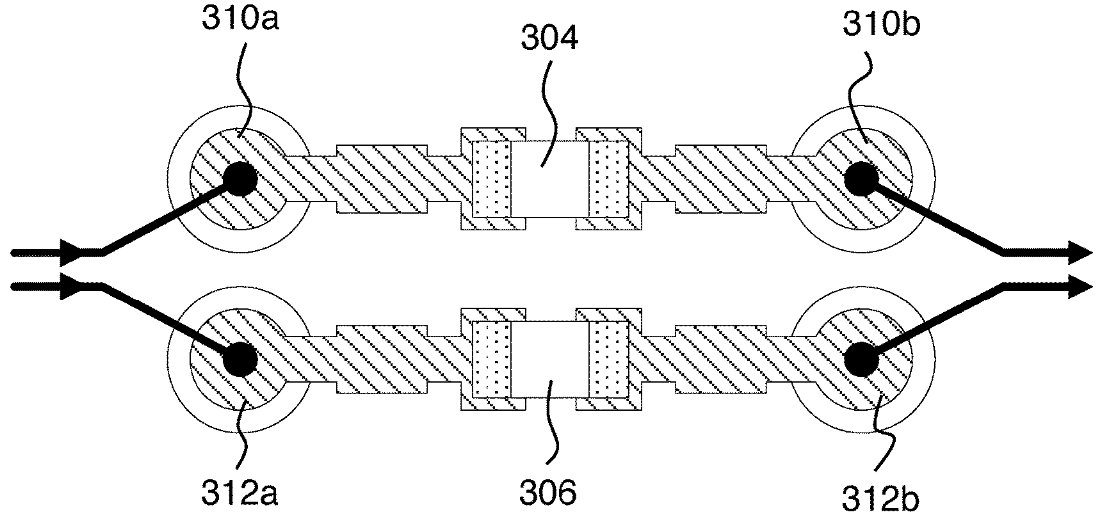

FIGS. 3A-C show examples of resistive networks that can be disposed on a space transformer. Such resistor networks can be implemented on a membrane or MLO disposed on the space transformer. FIG. 3A is an exemplary electrical schematic, and FIG. 3B is a corresponding physical implementation, where traces 310*a*, 310*b*, 312*a*, 312*b* are connected by surface mount resistors 302, 304, 306, 308. Here the resistances of resistors 302, 304, 306, 308 are R1, R2/2, R2/2, R3, respectively. Varying resistor values R1, R2, and R3 enables tuning of both impedance and attenuation level. FIG. 3C is a second example with resistors 302, 308 removed.

Attenuation of the first signal and/or the second signal can be by a fixed value that can be altered by an end user by changing at least one of the resistive components. In other words, an end user of the electrical test equipment may be able to change components such as 302, 304, 306, 308 on FIG. 3B (or components 304 and 306 on FIG. 3C) as needed to suit their specific testing needs.

Attenuation of the first signal and/or the second signal can include a differential attenuation of two signal paths. Alternatively, attenuation of the first signal and/or the second signal can include a single-ended attenuation of a single signal path. For simplicity of description, a single attenuated test is described in the preceding examples. However, probe testing of a device under test can include any number of tests, each having their separate attenuations defined by components disposed on the space transformer.

Figure 4:
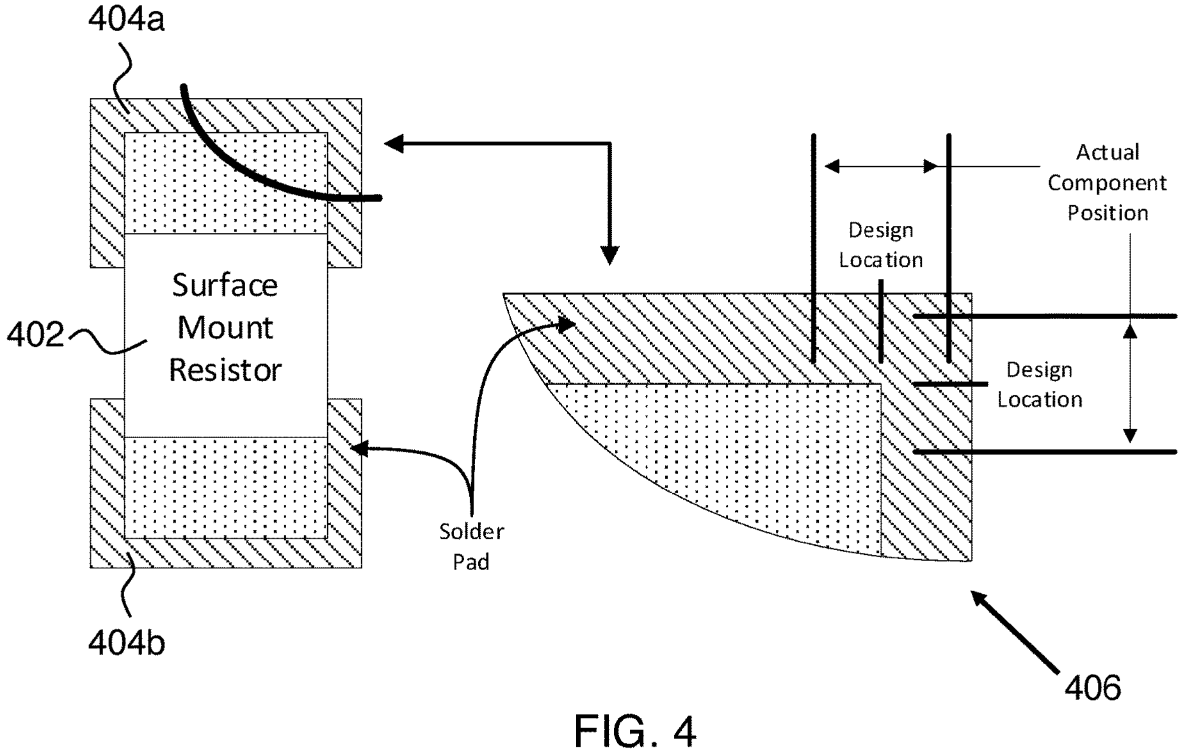
FIG. 4 shows some relevant design parameters for attenuators disposed on a space transformer.

FIG. 4 shows a surface mount resistor 402 connected to bond pads 402*a*, 402*b*. The resistance provided by resistor 402 in its circuit will depend on process variations, as schematically shown by 406, so it is typically important to account for such process variations in designing suitable space transformer resistive networks. More specifically, attenuator specifications and performance are highly dependent upon relative component placement on these pads, as well as pad size, and component "float" during the reflow stage during assembly. 406 on FIG. 4 illustrates the physical variance owing to component float and placement errors. These effects should be considered in design for implementation of these attenuator structures.

Thus, design of the resistive components preferably accounts for one or more process parameters selected from the group consisting of: resistive component placement accuracy, resistive component motion during reflow, and sizes of contact pads on the space transformer that resistive components make contact to.

Figure 5:
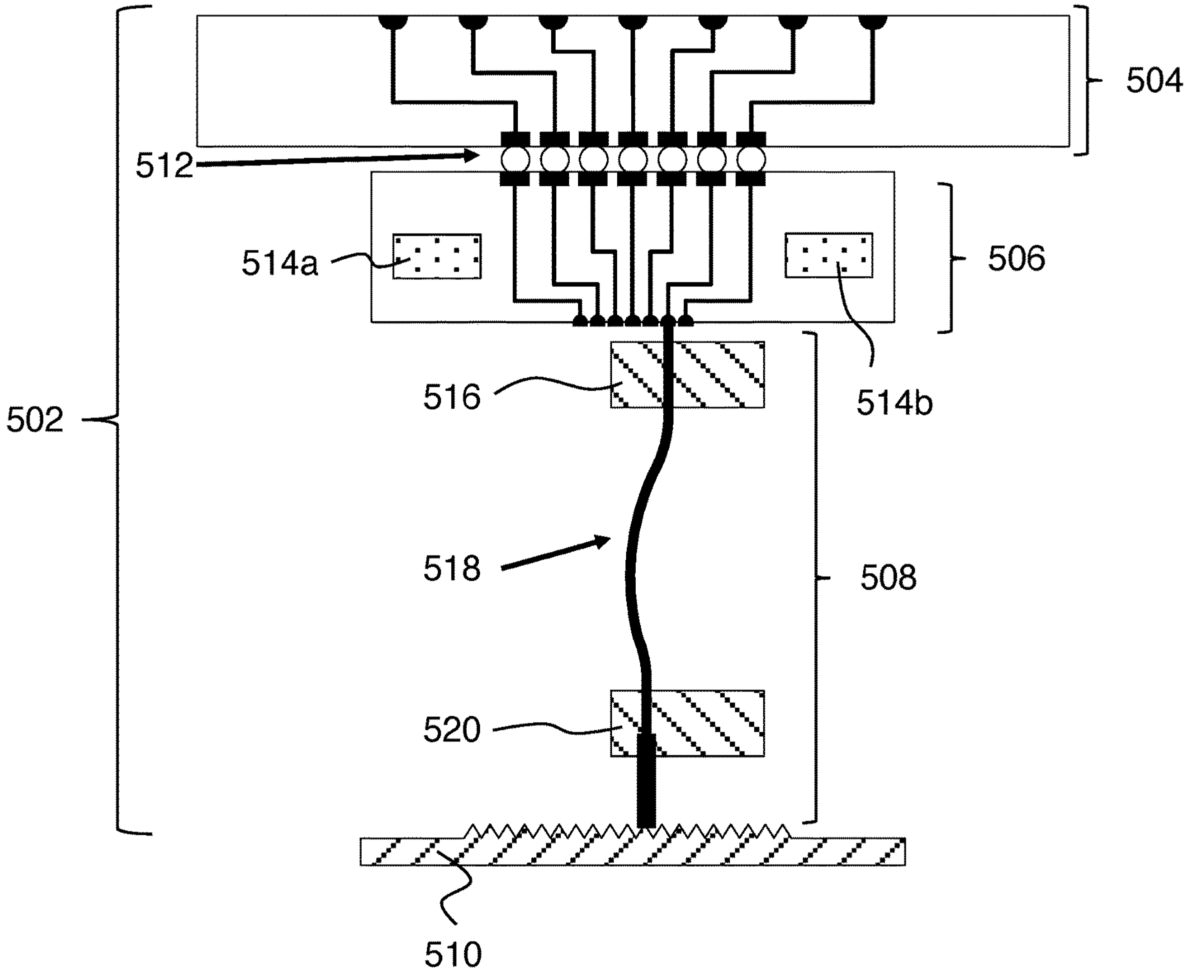
FIG. 5 shows a second example of a probe head operating in accordance with an embodiment of the invention.

FIG. 5 shows another exemplary probe head according to an embodiment of the invention. Here probe head 502 probes device under test 510. Probe head 502 includes printed circuit board 504, space transformer 506, and a vertical probe array 508. Printed circuit board 504 is connected to space transformer 506 with, for example, a ball grid array 512. Space transformer 506 includes attenuation elements 514*a* and 514*b* as described above. For simplicity, the signal paths attenuated by components 514*a* and 514*b* are not shown here. This concept is the same as shown on FIG. 2 or FIG. 6, so it need not be repeated here. Probe array 508 includes upper guide plate 516, lower guide plate 520, and probes 518. Thus, FIG. 5 depicts an application of attenuators on the space transformer in connection with guide plate-based probes. Thus, the probe array can be an array of vertical probes. Practice of the invention does not depend critically on the type of probe array used, so any other kind of probe array can also be used (e.g., cantilever probes, MEMS probes, etc.).

Figure 6:
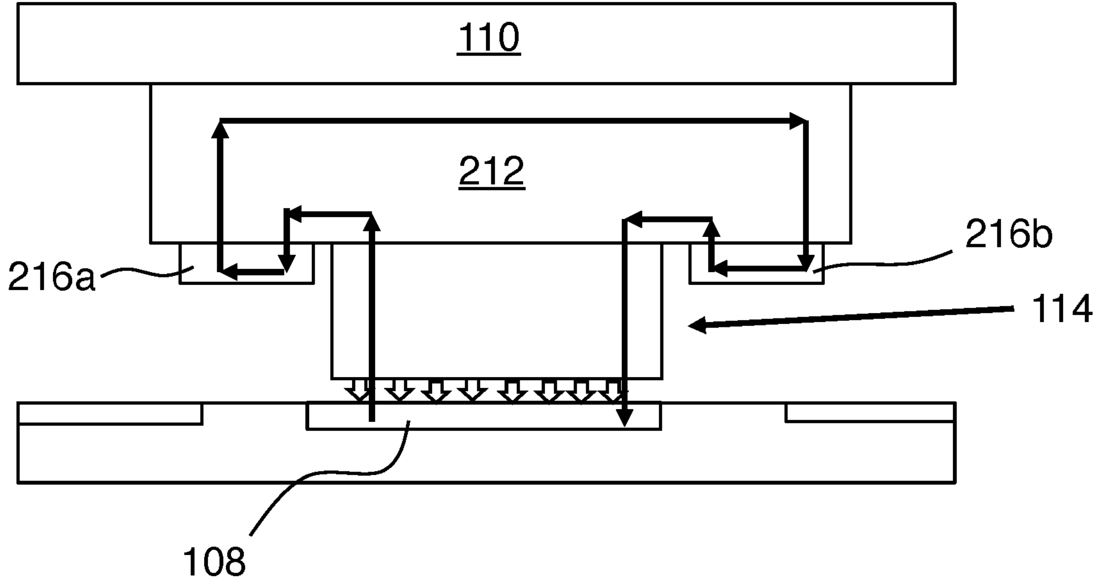
FIG. 6 shows an example of a probe head operating in accordance with an embodiment of the invention for loopback testing.

The preceding examples have considered testing where signals provided to the DUT and/or received from the DUT can be attenuated. It is also possible for attenuation on the space transformer to provide the attenuation for loopback testing. FIG. 6 shows an example. Here a first probe of the probe array receives a signal from device under test 108 and a second probe of the probe array provides an attenuated version of this signal to the device under test. In this example, such attenuation is provided by two resistive components 216*a* and 216*b* disposed on space transformer 212. However, practice of the invention does not depend on the number of resistive elements used to provide the attenuation, and any combination of elements that provides the desired attenuation can be employed.

Accordingly, embodiments of the invention include any method of electrical testing with probe arrays where attenuation for the testing is provided by one or more resistive components disposed on the space transformer.

The invention claimed is:

1. A method of providing a specified attenuation for probe testing, the method comprising:

making temporary electrical contact between a probe head and a device under test; and performing electrical testing of the device under test using the probe head;

wherein the probe head includes a space transformer having a first side in electrical contact with test equipment and a second side in direct electrical contact with a probe array;

wherein the electrical testing includes at least one test where an attenuation for the electrical testing is provided by one or more resistive components disposed on the space transformer;

wherein the electrical testing includes at least one loop-back test where a first probe of the probe array receives a signal from the device under test and where a second probe of the probe array provides an attenuated version of the signal to the device under test;

wherein the attenuated version of the signal is attenuated by the one or more resistive components disposed on the space transformer.

2. The method of claim 1, wherein the attenuation for the electrical testing is a fixed value that can be altered by an end user by changing at least one of the resistive components.

3. The method of claim 1, wherein the attenuation for the electrical testing includes a differential attenuation of two signal paths.

4. The method of claim 1, wherein the attenuation for the electrical testing includes a single-ended attenuation of a single signal path.

5. The method of claim 1, wherein a frequency of the electrical testing is in a range from 0.1 GHZ to 120 GHZ.

6. The method of claim 1, wherein the resistive components include resistors disposed on a multi-level organic substrate that is disposed on the space transformer.

7. The method of claim 1, wherein design of the resistive components accounts for one or more process parameters selected from the group consisting of: resistive component placement accuracy, resistive component motion during reflow, and sizes of contact pads on the space transformer that resistive components make contact to.

8. The method of claim 1, wherein the device under test is part or all of a wafer.

9. The method of claim 1, wherein the probe array is an array of vertical probes.

10. The method of claim 1, wherein the resistive components include surface mount technology components.

11. The method of claim 1, wherein a transmission line impedance for the electrical testing is 50Ω.

12. The method of claim 1, wherein a transmission line impedance for the electrical testing is a specified value other than 50Ω.

13. The method of claim 1, wherein the electrical testing includes at least one test where a first probe of the probe array sends a first signal to the device under test and where a second probe of the probe array receives a second signal from the device under test;

wherein the first signal and/or the second signal is attenuated by the one or more resistive components disposed on the space transformer.

* * * * *